United States Patent [19]

Priebe et al.

[11] Patent Number: 4,648,105
[45] Date of Patent: Mar. 3, 1987

[54] REGISTER CIRCUIT FOR TRANSMITTING AND RECEIVING SERIAL DATA

[75] Inventors: Gordon W. Priebe, Palm Bay, Fla.; Arthur D. Collard, Round Rock, Tex.

[73] Assignee: Motorola, Inc., Schaumburg, Ill.

[21] Appl. No.: 741,915

[22] Filed: Jun. 6, 1985

[51] Int. Cl.$^4$ ............................................. G11C 19/00
[52] U.S. Cl. ........................................ 377/64; 377/54; 328/104; 328/105
[58] Field of Search ................. 377/64, 54, 67, 69, 377/77, 70, 75; 328/103, 104, 105, 106, 152, 153, 154; 307/272 R, 272 A; 365/219

[56] References Cited

U.S. PATENT DOCUMENTS

| | | | |
|---|---|---|---|
| 3,167,738 | 1/1965 | Westerfield | 377/54 |
| 3,281,700 | 10/1966 | Young | 328/106 |
| 4,034,156 | 4/1977 | Willmore | 377/54 |

*Primary Examiner*—John S. Heyman
*Assistant Examiner*—Karl Ohralik
*Attorney, Agent, or Firm*—John A. Fisher; Jeffrey Van Myers; Robert L. King

[57] ABSTRACT

A register circuit for serial transmission or reception of digital data in a microprocessor controlled system is provided. A first plurality of rank ordered latches is provided to receive in parallel data to be transmitted. A second plurality of rank ordered latches is provided wherein each of the second plurality of latches except the highest ranked latch interconnects the first plurality of latches. The first and second plurality of latches function together to serially clock output data to be transmitted. The two pluralities of latches form a single register circuit which also serially receives data and latches the received data in response to a control circuit implemented as a "walking one" register. After the serially received data is latched, the data is provided for use by the microprocessor controlled system in parallel output form.

6 Claims, 5 Drawing Figures

REGISTER CIRCUIT FOR TRANSMITTING AND RECEIVING SERIAL DATA

TECHNICAL FIELD

This invention relates generally to data communication, and more particularly, to data communication in a system controlled by a processor.

BACKGROUND ART

Circuits which are capable of transmitting and receiving serial digital data wherein both modes of communication do not occur simultaneously are commonly used in microprocessor based systems. Others have used data registers to store transmit and receive data used for communication via a data bus internal to the processor based system. Two separate sets of data registers are commonly used for storing the data in a transmit and a receive portion, respectively. Two sets of shift registers are each commonly coupled to a respective set of data registers for serially receiving data from a source external to the system or for transmitting data to an external source. Disadvantages associated with using two distinct sets of data registers for transmit and receive functions include the amount of circuitry required and the associated interconnect routing. Additionally, justification of data in the shift registers must be correct to avoid data errors and may require additional circuitry.

BRIEF DESCRIPTION OF THE INVENTION

Accordingly, an object of the present invention is to provide an improved register circuit for transmitting and receiving serial data.

Another object of the present invention is to provide an improved serial data communication system for transmitting and receiving serial data.

Yet another object of the present invention is to provide an improved transmitter/receiver which minimizes circuitry in a processor based communication system.

In carrying out the above and other objects of the present invention, there is provided, in one form, a circuit for transmitting or receiving data serially. Control means asynchronously serially receive a plurality of receive data bits and selectively provide each of the receive data bits at a predetermined one of a plurality of rank ordered control output terminals. A first rank ordered plurality of n latch means is provided, where n is an integer and wherein each latch has a data input terminal coupled to a corresponding ranked control output terminal of the control means. Each latch of the first rank ordered plurality selectively receives one of the receive data bits and provides the predetermined bit at a predetermined one of a plurality of n parallel receive bit terminals. A second rank ordered plurality of (n-1) latch means is provided wherein each latch of the second plurality has a data output coupled to the data input terminal of a corresponding ranked latch means of the first plurality of latch means, and each ranked latch of the second plurality has an input coupled to the receive bit terminal of the latch of next lower rank of the first plurality of latch means. Each latch of the second plurality has an input coupled to the receive bit terminal of the latch of next lower rank of the first rank ordered latch means. The second plurality of latch means serially shifts transmit data bits thru the first rank ordered plurality of latch means in response to a transmit clock signal to provide transmit bits at the receive bit terminal of the lowest ranked latch of the first plurality of latches.

These and other objects, features and advantages will be more clearly understood from the following detailed description taken in conjunction with the accompanying drawings.

DETAILED DESCRIPTION OF THE INVENTION

Figure 1:
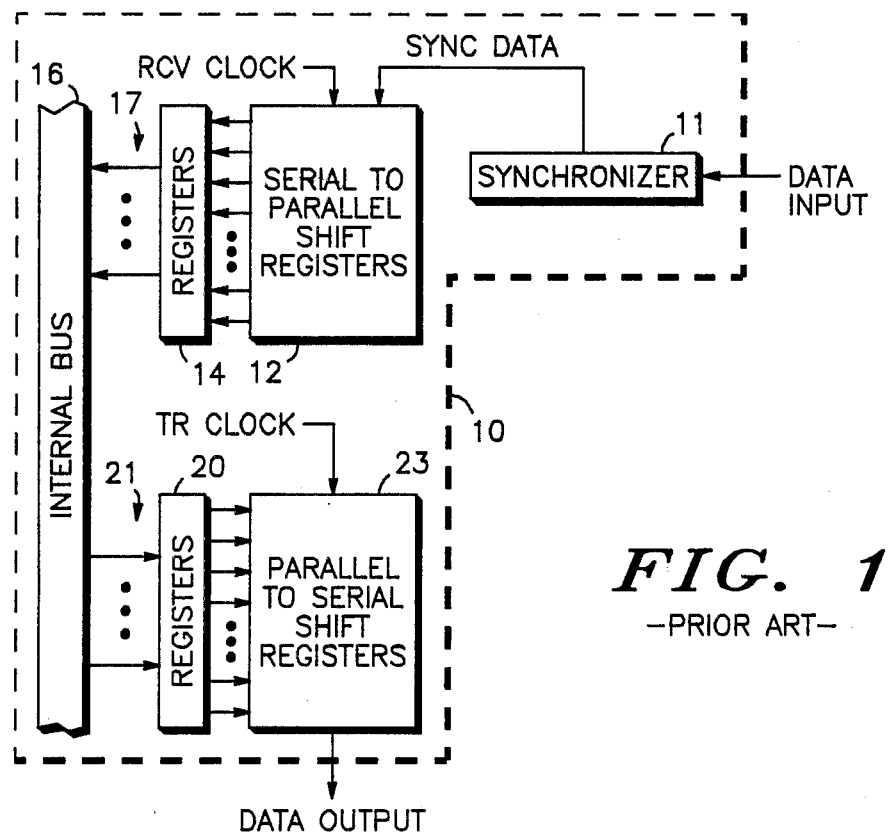
FIG. 1 illustrates in block diagram form a transmit/receive register circuit in a microprocessor based system which is known in the art.

Shown in FIG. 1 is a portion of a microprocessor based communication system 10 known in the art and used for receiving and outputting serial data. A data synchronizer circuit 11 typically receives asynchronous data at an input terminal and provides data labeled "sync data" which is synchronized to a system clock at an output. The output of synchronizer circuit 11 is connected to a single input terminal of a plurality of serial to parallel shift register circuits 12. A receive clock control signal labeled "rcv clock" is coupled to a control input of shift register circuits 12. Shift register circuits 12 have a plurality of outputs, each of which is connected to a predetermined one of a plurality of inputs of data registers 14. Data registers 14 are connected to an internal data bus 16 via data conductors 17. Internal data bus 16 is also connected to a plurality of data registers 20 via data conductors 21. Each of a plurality of parallel outputs of data registers 20 is connected to a predetermined one of a plurality of parallel inputs of parallel to serial shift registers 23. A transmit clock control signal labeled "tr clock" is connected to a control terminal of shift registers 23. An output of shift registers 23 provides serial output data at a terminal labeled "data output".

In operation, input data which is synchronized by synchronizer circuit 11 is serially loaded into shift registers 12 in response to the receive clock control signal. The received data may then be loaded in parallel into the plurality of series-connected data registers 14. In response to a control signal (not shown) received via one of the data conductors 17 from the microprocessor based communication system 10, the received data may be coupled from registers 14 to a predetermined location via the internal data bus 16. The data in registers 14 may also be selectively updated or replaced by newly received data.

In the illustrated form, data provided by communication system 10 may also be transmitted to an external location in response to the transmit clock control signal. Data to be transmitted is coupled to the series-connected data registers 20 via one of the data conductors 21. The data is then loaded in parallel to shift registers 23 where the data is serially transmitted. A disadvantage with the illustrated, transmit and receive operations of communication system 10 is the inefficiency associated with the use of separate data and shift registers for both the transmit and receive portions of communication system 10. As a result, a large amount of circuitry and space is required. Also, because timing differences may exist between the transmit and receive functions, additional control circuitry may be needed to justify data and ensure that data is correctly shifted.

Figure 2:
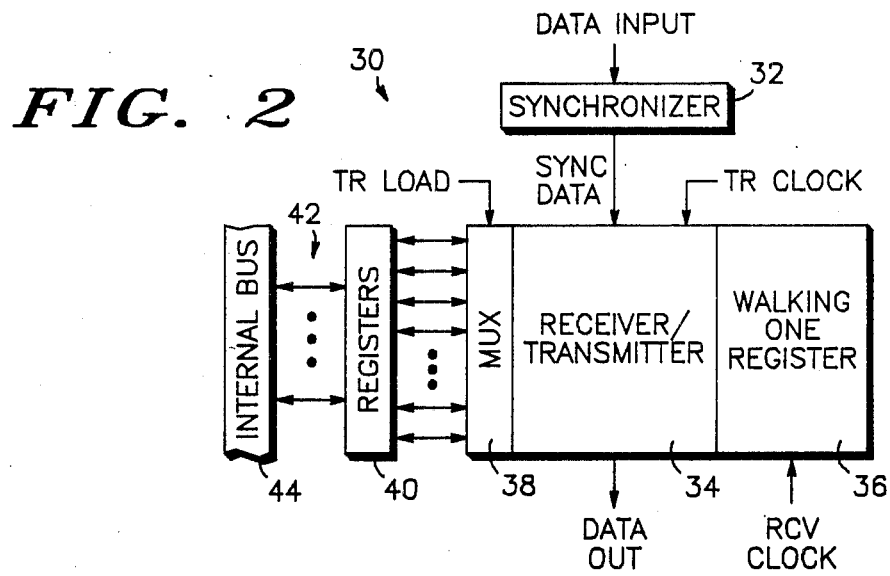
FIG. 2 illustrates in block diagram form a transmit/receive register circuit in a microprocessor based system in accordance with the present invention.

Shown in FIG. 2 is a register circuit 30 in accordance with the present invention. A data input terminal for receiving serial data is coupled to a synchronizer circuit 32, and an output of synchronizer 32 is coupled to a data input of a receiver/transmitter circuit 34 for receiving synchronized data labeled "sync data". A receive clock control signal labeled "rcv clock" is coupled to a control input of a "walking one" register circuit 36. Register circuit 36 is connected to receiver/transmitter circuit 34 as will be shown in detail in FIG. 3. Receiver/transmitter circuit 34 has a control input for receiving a transmit clock control signal labeled "Tr clock" and a serial data output labeled "Data Out" for providing serial transmitted data. Receiver/transmitter circuit 34 is connected to a multiplexer circuit 38 having a plurality of data terminals connected to a plurality of data terminals of a data register 40 having a plurality of data registers. A transmit load control signal labeled "Tr Load" is connected to a control terminal of multiplexer circuit 38. A plurality of data conductors 42 is connected to an internal data bus 44 which is internal to a microprocessor controlled system which includes transmit/receive circuit 30.

In the illustrated form, a single circuit (receiver/transmitter 34) is used as the receiver and transmitter, and one set of data register 40 interfaces with an internal data bus as opposed to using two sets of shift registers and data registers as shown in FIG. 1. Receiver/transmitter circuit 34 is shown as a parallel load input and parallel output receiver and a parallel load input and serial output transmitter. The receiver portion of circuit 34 is loaded in response to "walking one" register circuit 36. Data is transferred between data registers 40 and receiver/transmitter circuit 34 via multiplexer circuit 38. The operation of the present invention may be better understood in connection with an illustration of receiver/transmitter circuit 34 and register circuit 36.

Figure 3:
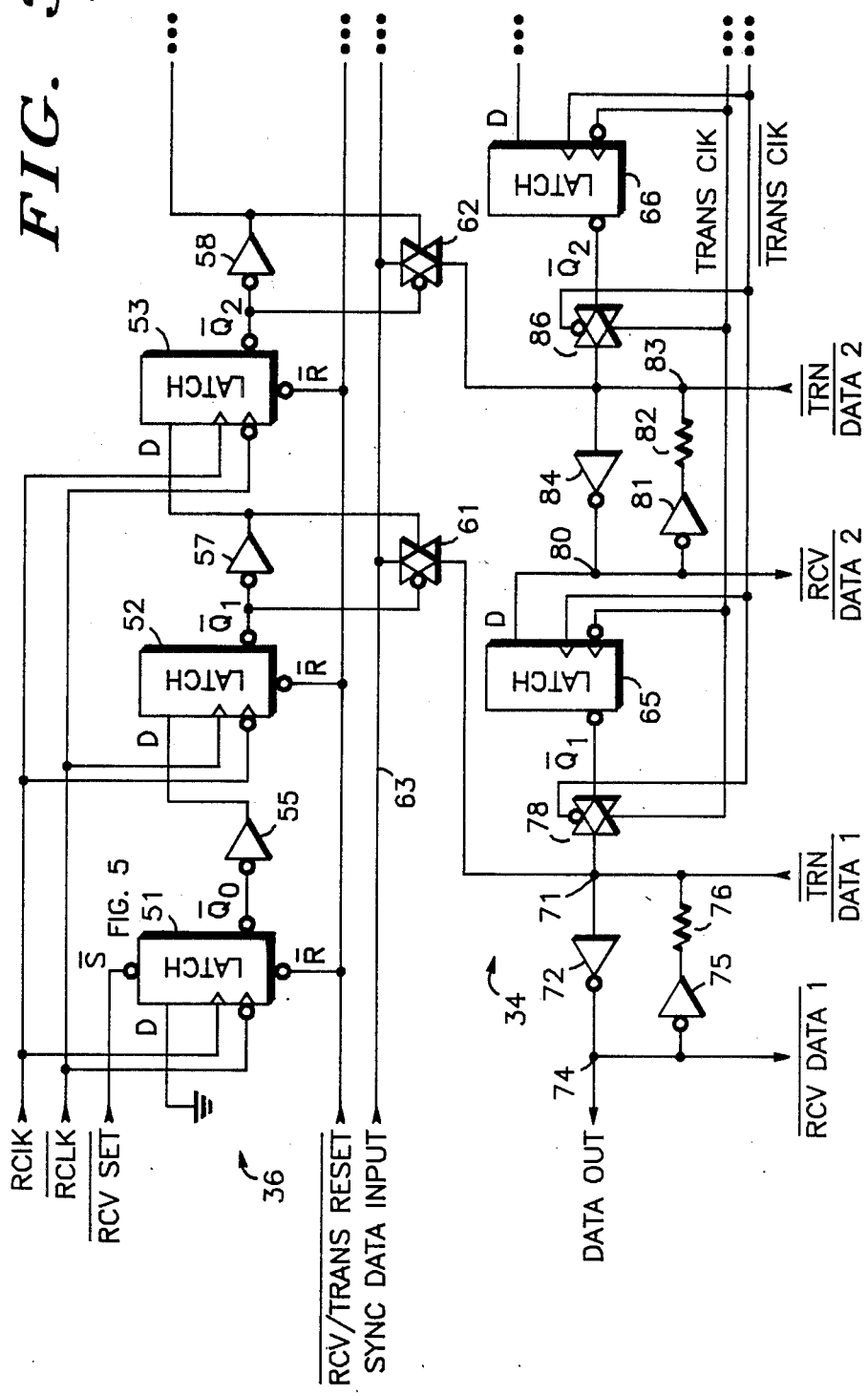
FIG. 3 illustrates in partial schematic form the transmit/receive circuit of FIG. 2.

Shown in FIG. 3 is a preferred form of receiver/transmitter circuit 34 and register circuit 36 illustrating an n-bit transmit and receive circuit, where n is an integer. Register circuit 36 comprises a plurality of rank ordered (n+1) latch circuits including a set/reset latch circuit 51 and n reset latch circuits such as latch circuits 52 and 53. Each of latch circuits 51, 52 and 53 has a conventional D data input, a clock and complement clock input, a complement Q output, and a complement reset input. Latch circuit 51 also has a complement set input. The D data input of latch circuit 51 is connected to earth ground. A complement of the Q data output of latch circuit 51 labeled $\overline{Q}_0$ and representing the first latch output is connected to an inverting input of an inverter circuit 55, and an output of inverter circuit 55 is connected to a D data input of latch circuit 52. A complement of the Q data output of latch circuit 52 labeled $\overline{Q}_1$ and representing the second latch output is connected to an inverting input of an inverter 57. An output of inverter 57 is connected to a D data input of latch 53. A complement of the Q data output of latch circuit 53 labeled $\overline{Q}_2$ and representing the third latch output is connected to an inverting input of an inverter 58. An output of inverter 58 may be extended to connect to a D data input of a successive latch in an analogous stage as shown by the dots in FIG. 3. A receive clock signal labeled "RClk" is coupled to the clock input of latch circuits 51 and 53 and to the complement clock input of latch circuit 52. The complement of the receive clock signal is connected to the complement clock terminal of latch circuits 51 and 53 and to the clock terminal of latch circuit 52. A complement of a receive set signal labeled "$\overline{\text{RcvSet}}$" is coupled to a complement set terminal of latch circuit 51. Latch circuit 51 which is a set/reset latch is shown in further detail in FIG. 5. The complement of the Q data output of latch circuit 52 is connected to a P-channel control terminal of a conventional CMOS transmission gate 61. It should be readily apparent that the present invention may be practiced by using other types of switches than the illustrated transmission gate switches illustrated herein. An N-channel control electrode of transmission gate 61 is connected to both the output of inverter 57 and the D input of latch 53. The complement of the Q data output of latch circuit 53 is connected to a P-channel control electrode of a conventional CMOS transmission gate 62. An N-channel control electrode of transmission gate 62 is connected to the output of inverter 57 and to the D data input of an adjacent higher ranked latch (not shown). A first terminal of each of transmission gates 61 and 62 is coupled to a synchronized data control signal labeled "Sync Data Input" via a data input terminal 63. A receive/transmit reset complement signal labeled "RCV/TRANS RESET" is coupled to the complement reset input of latches 51, 52 and 53.

Receiver/transmitter circuit 34 comprises a rank ordered plurality of latch circuits including latch circuits 65 and 66, each of which is illustrated as having a data input D, a complement Q data output, a clock terminal and a complement clock terminal. A second terminal of transmission gate 61 is connected to a first transmit data input terminal 71 for receiving from multiplexer 38 a complement of a first data bit to be transmitted labeled "TrnData1". An input of an inverter 72 is connected to transmit data input terminal 71. An output of inverter 72 is connected to an output terminal 74 for providing serial output transmit data and for providing a complement of a first receive data bit labeled "$\overline{\text{RCV Data 1}}$". An input of an inverter 75 is connected to output terminal 74, and an output of inverter 75 is connected to a first terminal of a resistor 76. A second terminal of resistor 76 is connected to transmit data input terminal 71. A first terminal of a CMOS transmission gate 78 is connected to transmit data input terminal 71, and a second terminal of transmission gate 78 is connected to a complement Q data output terminal of latch 65. Latch 65 has a D data input connected to an output terminal 80 for providing the complement of a second receive data bit labeled "$\overline{\text{RCV Data 2}}$". An input of an inverter 81 is connected to output terminal 80. Inverter 81 has an output connected to a first terminal of a resistor 82. A second terminal of resistor 82 is connected to a second transmit data input terminal 83 for receiving from multiplexer 38 of FIG. 2 the complement of a second data bit to be transmitted, labeled "$\overline{\text{Trn Data 2}}$". An input of an inverter 84 is connected to transmit data input terminal 83. An output of inverter 84 is connected to output terminal 80. A second terminal of transmission gate 62 is connected to both a first terminal of a transmission gate 86 and transmit data input terminal 83. The second terminal of transmission gate 86 is connected to a complement Q data output of latch 66. A transmit clock signal is coupled to N-channel control electrodes of transmission gates 78 and 86 and to complement clock terminals of latches 65 and 66. A complement transmit clock signal is coupled to P-channel control electrodes of transmission gates 78 and 86 and to the clock terminals of latches 65 and 66. Receiver/transmitter circuit 34 may be extended to n bits, where n is an integer, to include an nth stage (not shown) in a manner analagous to the circuitry associated with latches 65 and 66 as shown in FIG. 3 by the dotted extension lines.

Figure 4:
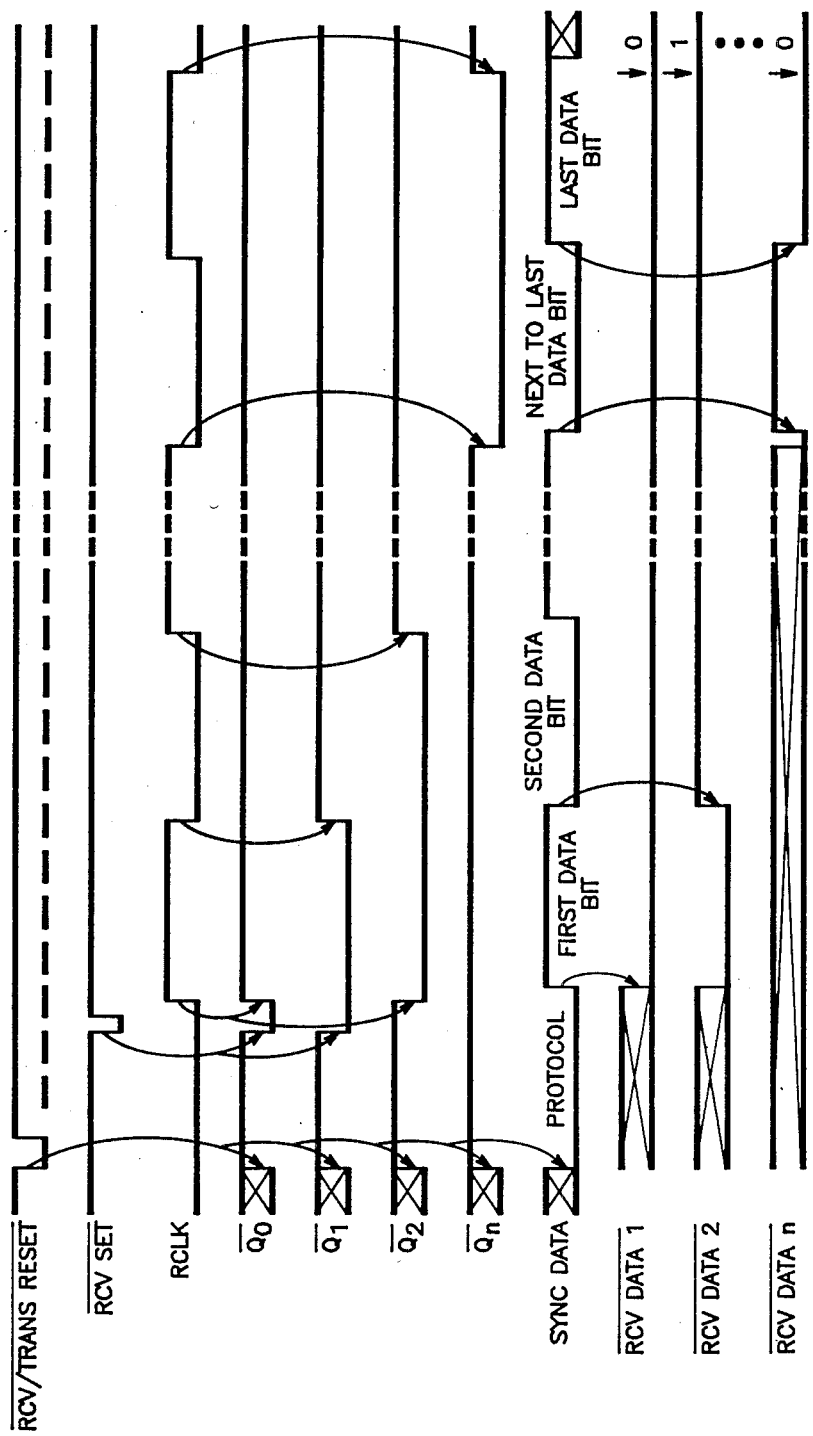
FIG. 4 illustrates in graphical form timing signals associated with the circuit of FIG. 3.

Referring to FIG. 4, the operation of the invention as illustrated in FIGS. 2 and 3 may be readily understood. Receiver/transmitter circuit 34 and "walking one" register 36 function to operate either in a transmit mode or in a receive mode, but not in both modes simultaneously. The mode of operation is chosen by the logic level of the receive/transmit reset complement signal. Initially assume that the receive/ transmit reset complement signal is at a high logic level. Assume also that the receive set complement signal is at a high logic level and that the receive clock signal is at a low logic level. The actual value of the complement Q outputs of all n latches of receiver/transmitter 34 is irrelevant at this point in time as illustrated by the "X" in FIG. 4. Assume that at some point in time the receive/transmit reset complement signal changes logic level so that the complement Q data output of each of latches of "walking one" register 36, including latches 51, 52 and 53, changes logic level. If the receive/transmit reset complement signal transitions to a low logic level, the complement Q output of each of latches 51, 52 and 53 transitions to a high logic level which disables transmission gates 61 and 62. Although the synchronized data signal, Sync Data, is illustrated as a logic low level in response to the complement reset signal, no meaningful data is present at the first terminals of transmission gates 61 and 62 during this time. Typically, the sync data signal contains protocol information during a first cycle of the receive clock after reset has occurred. The protocol information may be start bits which may be otherwise used by the communication system containing register circuit 30 to indicate that a data transfer is to occur. The receive/transmit complement reset signal may either remain at a low logic level or return back to a high logic level. If the logic level of the reset signal remains at a low level, receiver/transmitter circuit 34 will be in the transmit mode and walking one register circuit 36 will be disconnected from receiver/transmitter circuit 34 during the transmit mode. If, however, the logic level of the complement reset signal returns to a high logic level, receiver/transmitter circuit 34 will be in the receive mode in which "walking one" register circuit 36 controls the loading of received data into receiver/transmitter circuit 34. For purposes of illustration, an example of the receive mode is illustrated in FIG. 4. Assume that after the receive mode of operation has been chosen, latch 51 is set by the transition of the receive set complement signal from a high level to a low level. In response to the receive set complement signal transition, the complement Q data output of latches 51 and 52 both transition from a high to a low logic level. Shortly thereafter and before either latch 51 or 52 is clocked, the receive set complement signal returns to a high logic level. In response to the receive clock transitioning from a low logic level to a high level, the complement Q data output of latch 51 returns to a high logic level due to the presence of a low level ground at the D data input of latch 51. The output of latch 52 remains at a low logic level in response to the receive clock signal initially transitioning to a high level because of the high logic level output of inverter 55 which is connected to the D data input of latch 52. During the time when the complement Q output of latch 52 is at a low logic level, transmission gate 61 is made conductive. Shortly after the receive clock occurs, the first data bit is coupled to each of switches 61 and 62 and to other analagous n switches not shown. During the time the first data bit is present at data terminal 63, only switch 61 is conductive. Therefore, the first data bit is synchronously coupled to node 71 where the data bit is latched and held by inverters 72 and 75 and made available for output at terminal 74. Assuming for the purpose of illustration only that the first data bit is a logic one or high logic signal, the logic level of the first receive data output is low. The complement receive data 1 signal is held until the last data bit has been captured at which time all of the received data bits are coupled in parallel to multiplexer 38. At the falling edge of the receive clock, RClk, the complement Q output of latch 52 transitions back to a high logic level which disables switch 61. Since latch 52 has the clock input terminal connected to the complement receive clock signal and latch 53 has the clock input terminal connected to the receive clock signal, the complement Q output of latch 53 remains at a low logic level until the clock signal transitions to a high logic level. Therefore, switch 62 is conductive. Shortly thereafter, the second data bit is synchronously coupled to data terminal 63 where the data is latched by inverters 81 and 84 at output terminal 80. It should be noted that during the first data bit period, the first data bit was latched at both output terminals 74 and 80. However, the correct data bit is latched at output terminal 80 at the end of the second data period. Walking one register 36 functions to literally walk a logic one output from latches 51 and 52 thru the series of n rank ordered latches. At any one time until the final data bit is reached, two adjacent latches will have a one logic level Q output. Therefore, the same received data bit will be latched at two output terminals except for the last data bit. However, when the last data bit has been synchronously coupled to data input terminal 63, each of the serial data bits will be properly latched at a corresponding ranked receive output terminal of receiver/transmitter circuit 34. Since the last of the n data bits has a logic high level, the value of the nth complement receive data bit is a logic low level as shown in FIG. 4. For the example shown in FIG. 4, the output data which was captured includes the bits 0, 1 . . . 0 Receiver/transmitter circuit 34 therefore may be considered to comprise both a first rank ordered plurality of (n-1) latch circuits wherein each latch comprises one of the rank ordered latches 65, 66, etc. and a second rank ordered pluratity of latches. The individual latches of the second rank ordered latches comprise inverters 72, 75 and switch 78 as a first latch, inverters 81, 84 and switch 86 as a second latch, etc., respectively from lowest rank to highest rank. Each combination of the first and second latches of corresponding rank may also be considered as one of a plurality of rank ordered slave presettable flip flop circuits in conjunction with one of switches 61, 62, etc. of corresponding rank.

In the transmit mode, the complement of the receive/transmit reset signal remains at a logic low level so that register circuit 36 is disconnected from transmit/receive circuit 34 during the entire transmit operation. The complement value of one of a plurality of data bits to be transmitted is coupled to a respective transmit data input terminal such as input terminals 71, 83 and similar input terminals of extended stages not shown. Transmit data bit 1 is latched by inverters 72 and 75 at output terminal 74. Similarly, transmit data bit 2 is latched by inverters 84 and 81 at the D data input of latch 65, and transmit data bit 3 is presented to the D data input of latch 66 by extended circuitry not shown. A transmit clock which, is synchronous with a system clock of communication system 10 is coupled to the clock inputs of each latch of receiver/transmitter circuit 34. As each latch of receiver/transmitter circuit 34 is clocked, a transmission gate at the complement Q output of each latch couples the output of the latch to the inverter latch of next higher rank. In this manner, all of the transmit data bits are clocked through the rank ordered plurality of latch circuits in an order from least significant to most significant.

Figure 5:
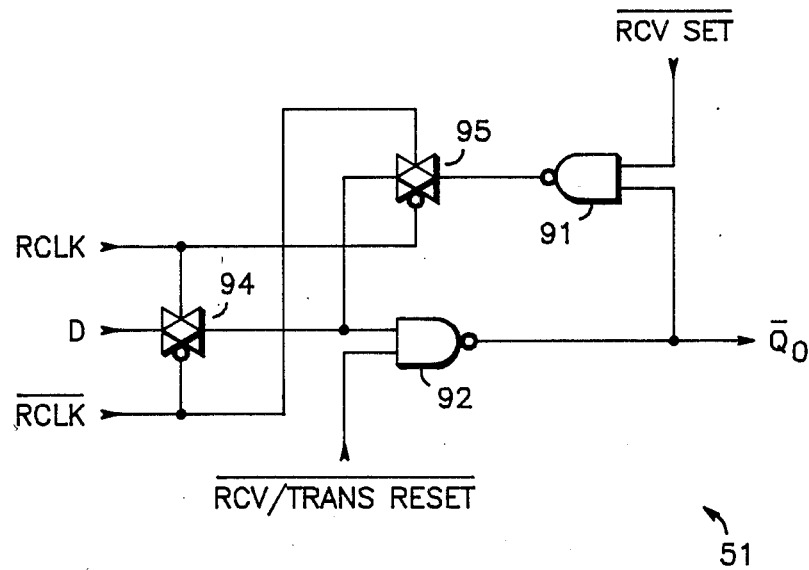
FIG. 5 illustrates in block diagram form a set/reset latch circuit illustrated in FIG. 3.

Shown in FIG. 5 is a preferred implementation of set/reset latch 51 of walking one register circuit 36. A NAND gate 91 has a first input coupled to the complement of the receive set signal, Rcv Set, and a second input connecte,d to an output of a NAND gate 92 which provides the complement $Q_0$ output. A first input of NAND gate 92 is coupled to the complement of the receive/transmit reset signal. The D data input is coupled to a first terminal of a CMOS transmission gate 94. A second terminal of transmission gate 94 is connected to both a second input of NAND gate 92 and to a first terminal of a CMOS transmission gate 95. A second terminal of transmission gate 95 is connected to an output of NAND gate 91. The receive clock, RClk, is coupled to an N-channel control electrode of transmission gate 94 and to a P-channel control electrode of transmission gate 95. The complement of the receive clock signal is coupled to a P-channel control electrode of transmission gate 94 and an N-channel control electrode of transmission gate 95.

In operation, data either passes through latch 51 or is latched at the output of NAND gate 92 when both the complement receive set signal and the complement receive/transmit reset signal are both at a high logic level. If one or both of the complement reset and set signals are at a low logic level, latch 51 neither latches or passes data. Whether latch 51 actually latches or passes data is dependent upon the logic level of the receive clock signal. When the receive clock signal is at a high logic level, data is passed from the D input of latch 51 to the complement Q output terminal without being latched at the Q output terminal. Conversely, when the receive clock signal is at a low logic level, data is not passed from the D input of latch 51 but is latched at the complement Q output terminal. Therefore, latch 51 has both a set and reset function unlike the other latch circuits of register circuit 36.

By now it should be apparent that the present invention provides a register circuit which utilizes a single register circuit to perform receive and transmit operations of serial data. The single register operates with dual preset capabilities so that transmit data may be received in parallel and transmitted in series or data may be received serially and outputted in parallel for use in a processor based system. Received data is justified upon receipt and a minimal amount of logic circuitry is used to perform both a transmit and receive function.

While an embodiment has been disclosed using certain assumed parameters, it should be understood that certain obvious modifications to the circuit or the given parameters will become apparent to those skilled in the art, and the scope of the invention should be limited only by the scope of the claims appended hereto.

We claim:

1. A circuit for transmitting or receiving data serially, comprising:
    control means for asynchronously serially receiving a plurality of receive data bits and selectively providing each of the receive data bits at a predetermined one of a plurality of rank ordered control output terminals;
    a first rank ordered plurality of n latch means, where n is an integer, each of said first rank ordered latch means having a data input terminal connected to a predetermined control output terminal of corresponding rank, for either selectively receiving one of the receive data bits and providing the received receive data bit at a predetermined one of a plurality of n parallel receive bit terminals or receiving one of a plurality of transmit data bits; and
    a second rank ordered plurality of (n-1) latch means, each of said second rank ordered plurality of latch means having an output coupled to the data input terminal of a corresponding ranked latch means of the first plurality of latch means, and each having an input coupled to the receive bit terminal of the latch of next lower rank of the first rank ordered latch means, said second rank ordered plurality of latch means serially shifting the transmit data bits thru the first rank ordered plurality of latch means in response to a transmit clock signal to serially provide transmit data bits at the receive bit terminal of the latch of lowest rank of the first plurality.

2. The circuit of claim 1 wherein said control means further comprise:
    set/reset latch means for selectively passing or latching data coupled to an input thereof in response to both a set and a reset signal;
    a third rank ordered plurality of n series connected latch means, the lowest ranked latch means coupled to the set/reset latch means, said third plurality of latch means providing a rank ordered plurality of control signals in response to a receive clock signal; and
    a rank ordered plurality of (n-1) switching means, each of said switching means providing one of the control output terminals and selectively coupling predetermined receive data bits to a predetermined data input terminal of the first plurality of latch means.

3. The circuit of claim 1 wherein each of the first plurality of latch means comprises:
    a first inverter circuit having an input coupled to a predetermined data input terminal, and an output coupled to a predetermined one of the receive bit terminals;
    a second inverter circuit having an input coupled to the predetermined receive bit terminal, and an output; and
    a resistor having a first terminal coupled to the output of the second inverter circuit and a second terminal coupled to the predetermined data input terminal.

4. The circuit of claim 1 wherein each of the second plurality of latch means comprises a non-set, non-reset latch circuit.

5. A circuit for asynchronously and serially transmitting and receiving digital data during different time periods, comprising:

control storage means comprising a plurality of rank ordered storage circuits, each of said storage circuits providing a rank ordered load control signal in coincidence with a predetermined bit of received data; and a plurality of rank ordered series-connected storage circuits for selectively storing received data in response to a plurality of the load control signals and providing the received data at a plurality of parallel received data terminals, and for selectively receiving a plurality of data bits to be transmitted at a plurality of parallel transmit data terminals; and means for serially clocking the series-connected storage circuits to transmit data.

6. A register circuit for asynchronously and serially transmitting and receiving digital data during different time periods, comprising:

control latch means having a plurality of rank ordered latch circuits, each of said latch circuits providing a rank ordred load control signal in conincidence with a predetermined bit of received data;

a plurality of series-connected rank ordered latch stages, the lowest ranked stage comprising:

an inverter latch comprising first and second inverters coupled in parallel with the input of the first inverter coupled to the output of the second inverter, and the output of the first inverter coupled to the input of the second inverter;

the remaining stages comprising:

a non-set, non-reset latch circuit having a data input and a data output for providing data to the next lower ranked stage; and an inverter latch comprising first and second inverters coupled in parallel with the input of the first inverter coupled to the output of the second inverter for receiving a predetermined one of the data bits to be transmitted, and the output of the first inverter coupled to both the input of the second inverter and the data input of the non-set, non-reset latch circuit.

* * * * *